(12) United States Patent
Kopp et al.

(10) Patent No.: US 12,249,679 B2
(45) Date of Patent: Mar. 11, 2025

(54) RADIATION EMITTING SEMICONDUCTOR CHIP AND METHOD FOR PRODUCING A RADIATION EMITTING SEMICONDUCTOR CHIP

(71) Applicant: OSRAM Opto Semiconductors GmbH, Regensburg (DE)

(72) Inventors: Fabian Kopp, Tanjung Tokong Penang (MY); Attila Molnar, Gelugor Penang (MY)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 527 days.

(21) Appl. No.: 17/630,534

(22) PCT Filed: Jul. 28, 2020

(86) PCT No.: PCT/EP2020/071250
§ 371 (c)(1),
(2) Date: Jan. 27, 2022

(87) PCT Pub. No.: WO2021/018884
PCT Pub. Date: Feb. 4, 2021

(65) Prior Publication Data
US 2022/0278259 A1    Sep. 1, 2022

(30) Foreign Application Priority Data

Jul. 29, 2019    (DE) .......................... 102019120444.5

(51) Int. Cl.
*H01L 33/60* (2010.01)
*H01L 33/00* (2010.01)
*H01L 33/62* (2010.01)

(52) U.S. Cl.
CPC ............ *H01L 33/60* (2013.01); *H01L 33/005* (2013.01); *H01L 33/62* (2013.01); *H01L 2933/0058* (2013.01)

(58) Field of Classification Search
None
See application file for complete search history.

(56) References Cited

U.S. PATENT DOCUMENTS

2009/0256494 A1 * 10/2009 Nishinaka .............. H01L 33/06
                                                                    315/291
2010/0032694 A1 *  2/2010 Kim ....................... H01L 33/42
                                                                  257/E33.056

(Continued)

FOREIGN PATENT DOCUMENTS

DE    102015118041 A1    4/2017
DE    102016112587 A1    1/2018

(Continued)

OTHER PUBLICATIONS

Search Report for German Patent Applicaiton No. 10 2019 120 444.5, issued on Apr. 14, 2020, 4 pages (for reference purposes only).

(Continued)

*Primary Examiner* — Erik T. K. Peterson
*Assistant Examiner* — Christopher A. Schodde
(74) *Attorney, Agent, or Firm* — VIERING, JENTSCHURA & PARTNER mbB

(57)    ABSTRACT

A radiation emitting semiconductor chip may include a semiconductor layer sequence having an active region configured to generate electromagnetic radiation, a first dielectric mirror layer arranged above the semiconductor layer sequence, and a second dielectric mirror layer arranged above the first dielectric mirror layer. The first dielectric mirror layer may have at least one first recess. A first current spreading layer may be arranged in the first recess and above (Continued)

the first dielectric mirror layer. The second dielectric mirror layer may have at least one second recess extending up to the first current spreading layer. The first recess may not overlap with the second recess in lateral direction in plan view. Furthermore, a method for producing a radiation emitting semiconductor chip is disclosed.

12 Claims, 4 Drawing Sheets

(56) References Cited

U.S. PATENT DOCUMENTS

| | | |
|---|---|---|
| 2017/0047484 A1* | 2/2017 | Kuo .................... H01L 33/405 |
| 2017/0288088 A1* | 10/2017 | Won Cheol ............ H01L 33/44 |
| 2018/0114887 A1 | 4/2018 | Hermann et al. |
| 2018/0301598 A1 | 10/2018 | Baur |
| 2019/0326471 A1 | 10/2019 | Kopp et al. |

FOREIGN PATENT DOCUMENTS

| | | |
|---|---|---|
| EP | 3490013 A1 | 5/2019 |
| EP | 2782147 B1 | 3/2020 |
| WO | 2015053600 A1 | 4/2015 |
| WO | 2016180734 A1 | 11/2016 |

OTHER PUBLICATIONS

International Search Report for International Application No. PCT/EP2020/071250, sent on Sep. 25, 2020, 4 pages (for reference purposes only).

* cited by examiner

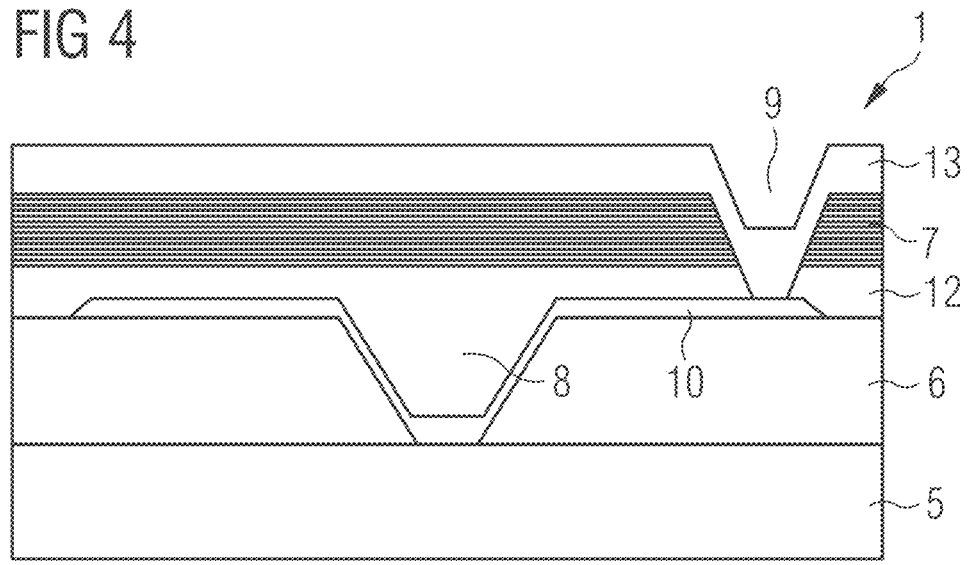
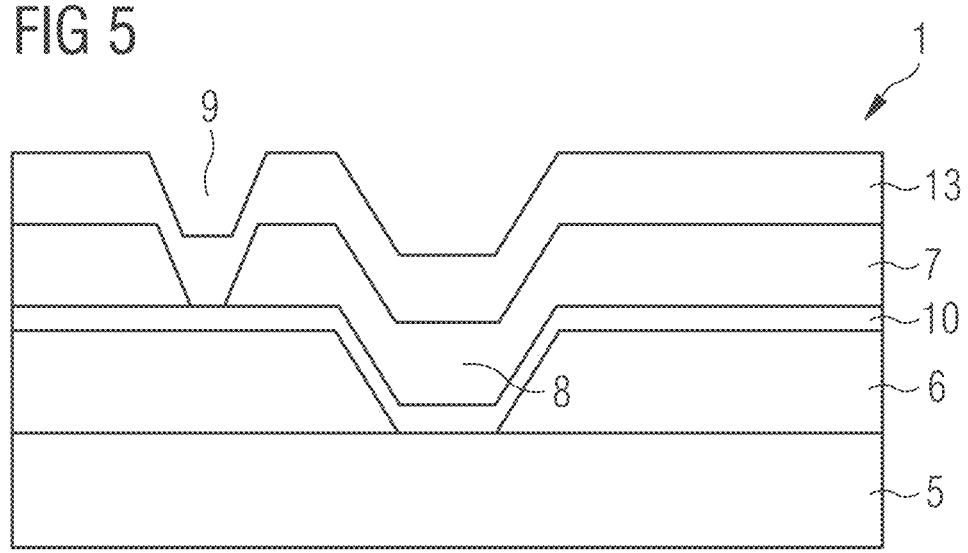

RADIATION EMITTING SEMICONDUCTOR CHIP AND METHOD FOR PRODUCING A RADIATION EMITTING SEMICONDUCTOR CHIP

CROSS-REFERENCE TO RELATED APPLICATIONS

The present application is a national stage entry according to 35 U.S.C. § 371 of PCT application No.: PCT/EP2020/071250 filed on Jul. 28, 2020; which claims priority to German Patent Application Serial No.: 10 2019 120 444.5 filed on Jul. 29, 2019; all of which are incorporated herein by reference in their entirety and for all purposes.

TECHNICAL FIELD

A radiation emitting semiconductor chip is provided. Furthermore, a Method for producing a Radiation emitting semiconductor chip is provided.

BACKGROUND

An object to be solved is to specify a radiation emitting semiconductor chip which has a particularly good efficiency. Furthermore, a method for producing a particularly efficient radiation emitting semiconductor chip is to be specified.

SUMMARY

According to at least one embodiment, the radiation emitting semiconductor chip comprises a semiconductor layer sequence having an active region configured to generate electromagnetic radiation. In a non-limiting embodiment, the semiconductor layer sequence is an epitaxial semiconductor layer sequence. In a non-limiting embodiment, the semiconductor layer sequence is based on a III-V compound semiconductor material. The III-V compound semiconductor material is, for example, a phosphide, arsenide and/or nitride compound semiconductor material, for example, InxAlyGa1-x-yP, InxAlyGa1-x-yAs and/or InxAlyGa1-x-yN with 0≤x≤1, 0≤y≤1 and x+y≤1.

The semiconductor layer sequence can have dopants as well as additional components. For the sake of simplicity, however, only the essential constituents of the crystal lattice of the semiconductor layer sequence, i.e. Al, Ga, In, N, As or P, are indicated, even if these can be partially replaced and/or supplemented by small amounts of further substances.

The semiconductor layer sequence may have a main extension plane. A vertical direction extends perpendicular to the main extension plane and a lateral direction extends parallel to the main extension plane.

The semiconductor layer sequence may include a first semiconductor layer of a first conductivity type and a second semiconductor layer of a second conductivity type different from the first conductivity type. In a non-limiting embodiment, the first semiconductor layer is p-doped and thus formed p-conductive. In this case, the second semiconductor layer is n-doped and thus formed n-conductive. The first semiconductor layer and the second semiconductor layer may be stacked on top of one another in vertical direction.

In a non-limiting embodiment, the active region is arranged between the first semiconductor layer and the second semiconductor layer. The active region may have a pn junction for generating the electromagnetic radiation, such as a heterostructure, a single quantum well structure or a multiple quantum well structure.

The electromagnetic radiation generated during operation of the active region can be near-ultraviolet radiation, visible light and/or near-infrared radiation. For example, the visible light is light of blue, green, yellow or red colour.

According to at least one embodiment, the radiation emitting semiconductor chip comprises a first dielectric mirror layer arranged above the semiconductor layer sequence. The semiconductor layer sequence and the first dielectric mirror layer may be stacked in vertical direction. The first dielectric mirror layer may include or is formed from $SiO_2$. In particular, the first dielectric mirror layer can be a Bragg mirror. The Bragg mirror may include alternately arranged layers of a high refractive index material and a low refractive index material. The layers of the Bragg mirror may include $SiO_2$, $Al_2O_3$, $TiO_2$, tantalum oxide, $Nb_2O_5$, MgF, silicon nitrides and/or silicon oxynitrides.

The first dielectric mirror layer thereby may have a reflection of at least 98%, in particular of at least 99%, for the electromagnetic radiation generated in the active region.

According to at least one embodiment, the radiation emitting semiconductor chip comprises a second dielectric mirror layer arranged above the first dielectric mirror layer. The first dielectric mirror layer and the second dielectric mirror layer may be stacked on top of one another in vertical direction. In a non-limiting embodiment, the first semiconductor layer, the first dielectric mirror layer and the second dielectric mirror layer are stacked in the indicated order in vertical direction.

The second dielectric mirror layer may include or is formed from $SiO_2$. In particular, the second dielectric mirror layer can be a further Bragg mirror. The further Bragg mirror may include alternately arranged layers of a high refractive index material and a low refractive index material. The layers of the further Bragg mirror may include $SiO_2$, $Al_2O_3$, $TiO_2$, tantalum oxide, $Nb_2O_5$, MgF, silicon nitrides and/or silicon oxynitrides.

According to at least one embodiment, the first dielectric mirror layer comprises at least one first recess. The first recess may completely penetrate the first dielectric mirror layer. At least one side surface of the first recess may be formed by the first dielectric mirror layer. The side surface of the first recess may include an angle of at least 45° and at most 90° with the main extension plane. For example, the side surface of the first recess includes an angle of about 60° with the main extension plane.

The first recess may have a polygonal shape, a round shape or an elliptical shape. It is possible that a plurality of first recesses are arranged in the first dielectric mirror layer. The first recesses may be arranged spaced apart from one another in lateral direction. In a non-limiting embodiment, the first recesses are arranged in a matrix-like manner, i.e. along columns and rows. In a non-limiting embodiment, the first recesses are arranged at grid points of a first regular grid. The first regular grid may be a polygonal grid, such as an orthogonal grid or a hexagonal grid.

According to at least one embodiment, a first current spreading layer is arranged in the first recess and above the first dielectric mirror layer. In a non-limiting embodiment, the first current spreading layer completely covers the side surface of the first recess. In the region of the side surface of the first recess, the first current spreading layer may be in direct contact with the first dielectric mirror layer.

Furthermore, it is possible that the first recess exposes the semiconductor layer sequence. In this case, the first current spreading layer covers the exposed semiconductor layer sequence, in particular completely.

Furthermore, the first current spreading layer can extend in regions in lateral direction between the first dielectric mirror layer and the second dielectric mirror layer. The first current spreading layer may be in direct contact with the second dielectric mirror layer.

For example, the first current spreading layer is formed transparent to the electromagnetic radiation generated during operation. In a non-limiting embodiment, the first current spreading layer is formed with a transparent, electrically conductive material. The first current spreading layer may have transparent electrically conductive metals or transparent electrically conductive oxides (TCOs). TCOs are transparent conductive materials and have, for example, zinc oxide, tin oxide, cadmium oxide, titanium oxide, indium oxide or indium tin oxide (ITO).

The first current spreading layer may have an extension in lateral direction of at most 30 micrometres, such as at most 15 micrometres.

According to at least one embodiment, the second dielectric mirror layer comprises at least one second recess extending up to the first current spreading layer. The second recess may completely penetrate the second dielectric mirror layer. In the region of the second recess, the first current spreading layer may be exposed.

At least one side surface of the second recess may be formed by the second dielectric mirror layer. The side surface of the second recess may include an angle of at least 45° and at most 90° with the main extension plane. For example, the side surface of the second recess includes an angle of about 60° with the main plane of extension.

The second recess may have a polygonal shape, a round shape or an elliptical shape. It is possible that a plurality of second recesses are arranged in the second dielectric mirror layer. The second recesses may be arranged spaced apart from one another in lateral direction. In a non-limiting embodiment, the second recesses are arranged in a matrix-like manner, i.e. along columns and rows. In a non-limiting embodiment, the second recesses are arranged at grid points of a second regular grid. The second regular grid may be a polygonal grid, such as an orthogonal grid or a hexagonal grid.

In a non-limiting embodiment, the second recess exposes the first current spreading layer arranged between the first dielectric mirror layer and the second dielectric mirror layer. In a non-limiting embodiment, the first current spreading layer extends in lateral direction to the second recess so that the first current spreading layer is exposed by the second recess.

According to at least one embodiment, the first recess does not overlap with the second recess in lateral direction in plan view. In a non-limiting embodiment, the first recess is spaced apart from the second recess in lateral direction in plan view.

In at least one embodiment, the radiation emitting semiconductor chip comprises a semiconductor layer sequence having an active region configured to generate electromagnetic radiation, a first dielectric mirror layer arranged above the semiconductor layer sequence, and a second dielectric mirror layer arranged above the first dielectric mirror layer. In this case, the first dielectric mirror layer has at least a first recess and a first current spreading layer is arranged in the first recess and above the first dielectric mirror layer. In addition, the second dielectric mirror layer has at least one second recess extending to the first current spreading layer. Furthermore, the first recess does not overlap with the second recess in lateral direction in plan view.

One idea of the radiation emitting semiconductor chip described here is, inter alia, that a reflection coefficient in a boundary region of the semiconductor layer sequence and the first recess is formed to be particularly large.

Typically, semiconductor chips have a metallic contact layer in the first recess, which is configured to energise the semiconductor layer sequence. Furthermore, the electromagnetic radiation generated in the active region is usually reflected by at least 98% in the boundary region of the semiconductor layer sequence and the first dielectric mirror layer. In contrast, electromagnetic radiation in a boundary region of the semiconductor layer sequence and the metallic contact layer in the first recess is typically reflected by at most 96%.

However, in the semiconductor chip described here, the first recess may be free of a metallic contact layer. Furthermore, a second dielectric mirror layer is arranged above the first recess. With such an arrangement, electromagnetic radiation in the region of the first recess can advantageously be reflected by at least 98%. Such a semiconductor chip thus exhibits a particularly good efficiency.

According to at least one embodiment, the first recess is free of a metallic contact layer. In a non-limiting embodiment, an inner surface of the recess delimiting the recess is free of a metallic contact layer. In a non-limiting embodiment, no metal is arranged on the delimiting inner surface of the recess.

According to at least one embodiment, the first current spreading layer in the first recess is electrically conductively connected to the semiconductor layer sequence. In the region of the semiconductor layer sequence exposed by the first recess, the first current spreading layer may be in direct contact with the semiconductor layer sequence. If the first current spreading layer is in direct contact with the semiconductor layer sequence, the adjacent semiconductor layer may be an n-doped semiconductor layer.

According to at least one embodiment, a second current spreading layer is arranged between the first dielectric mirror layer and the semiconductor layer sequence. In a non-limiting embodiment, the second current spreading layer arranged between the semiconductor layer sequence and the first dielectric mirror layer is in direct contact with the semiconductor layer sequence and the first dielectric mirror layer. In this case, the adjacent semiconductor layer may be a p-doped semiconductor layer.

Furthermore, it is possible that the first recess exposes the second current spreading layer. In this case, the first current spreading layer covers the exposed second current spreading layer, in particular completely.

According to at least one embodiment, the first current spreading layer in the first recess is electrically conductively connected to the second current spreading layer. In this embodiment, the first recess exposes a portion of the second current spreading layer. The exposed second current spreading layer is in direct contact with the first dielectric mirror layer arranged in the first recess.

According to at least one embodiment, an intermediate layer is arranged between the first dielectric mirror layer and the second dielectric mirror layer. The intermediate layer may include a spin on glass (SOG). The spin on glass may include silicon dioxide, which can be doped with boron or phosphorus, for example. The intermediate layer may be in direct contact with the second dielectric mirror layer. Furthermore, the intermediate layer may be in direct contact with the first current spreading layer. Furthermore, it is possible that the intermediate layer is in direct contact with the first dielectric mirror layer in a region that is not covered by the first current spreading layer.

The intermediate layer may be formed reflective for the electromagnetic radiation generated by the active region. The intermediate layer thereby may have a reflection of at least 90%, in particular of at least 95%, for the electromagnetic radiation generated in the active region.

According to at least one embodiment, the intermediate layer completely fills the first recess. In a non-limiting embodiment, in this embodiment, the intermediate layer is in direct contact with the first current spreading layer in the first recess. In a non-limiting embodiment, the current spreading layer contours the shape of the first recess. In a non-limiting embodiment, the intermediate layer is a planarization layer which levels an unevenness caused by the first recess. Thus, the planarization layer may have a flat top surface.

The intermediate layer may protrude beyond the first current spreading layer and the first dielectric mirror layer in vertical direction. Furthermore, the intermediate layer may protrude beyond the first current spreading layer in lateral direction. The intermediate layer, which is formed as a planarization layer in this case, such as comprising the planar top surface, which extends in lateral direction, and is substantially smooth. "Substantially smooth" means here in particular that the top surface of the planarization layer has an average roughness of at most 100 nanometres.

Advantageously, the second mirror layer can thus be applied particularly well. If the second dielectric mirror layer is a Bragg mirror, the efficiency of the Bragg mirror is advantageously particularly good due to the planarization layer.

According to at least one embodiment, the second recess extends completely through the intermediate layer. In this embodiment, the intermediate layer may completely penetrate the second mirror layer and the intermediate layer. In this case, the side surface of the second recess may be formed by the second dielectric mirror layer and the intermediate layer.

According to at least one embodiment, the second recess completely surrounds the first recess in the lateral direction. That is to say that the second recess completely surrounds the first recess in lateral direction in plan view. In this embodiment, the second recess may be formed as a continuous trench.

According to at least one embodiment, a metallic contact layer is arranged above the second dielectric mirror layer. In a non-limiting embodiment, the metallic contact layer is in direct contact with the second dielectric mirror layer. The metallic contact layer may be formed reflective for the electromagnetic radiation generated in the active region. The metallic contact layer may have a reflection of at least 80%, in particular of at least 90%, for the electromagnetic radiation generated in the active region.

The metallic contact layer may include or consist of a metal. The metal is or contains, for example, one or more of the following metals: gold, silver, copper, tin, lead, bismuth and/or antimony, aluminium, rhodium.

According to at least one embodiment, the metallic contact layer is arranged in the second recess. In a non-limiting embodiment, the metallic contact layer completely covers the side surface of the second recess. If the side surface of the second recess is formed by the second dielectric mirror layer and the intermediate layer, the metallic contact layer may be in direct contact with the second dielectric mirror layer and the intermediate layer.

According to at least one embodiment, the metallic contact layer in the second recess is electrically conductively connected to the first current spreading layer. The second recess may expose the first current spreading layer. Thus, the metallic contact layer arranged in the second recess may be in direct contact with the first current spreading layer.

According to at least one embodiment, the second dielectric mirror layer is arranged in the first recess. In this case, the radiation emitting semiconductor chip may have no intermediate layer. In a non-limiting embodiment, in this embodiment, the second dielectric mirror layer is arranged on the first current spreading layer in a form fit manner. Thus, a top surface of the second dielectric mirror layer does not extend parallel to the main extension plane, but has a depression in the region of the first recess.

Furthermore, a method for producing a radiation emitting semiconductor chip is specified, by which the radiation emitting semiconductor chip described herein can be produced. All features and embodiments disclosed in connection with the radiation emitting semiconductor chip are therefore also applicable in connection with the method, and vice versa.

According to at least one embodiment of the method, a semiconductor layer sequence is provided comprising an active region configured to generate electromagnetic radiation.

According to at least one embodiment of the method, a first dielectric mirror layer is applied above the semiconductor layer sequence. In a non-limiting embodiment, the dielectric mirror layer is formed continuously. In this case, the dielectric mirror layer does not have a structuring. For example, the first dielectric mirror layer is applied above the semiconductor layer sequence by physical vapour deposition such as sputtering or evaporation or by chemical vapour deposition.

According to at least one embodiment of the method, a first recess is generated in the first dielectric mirror layer. The first recess completely penetrates the first dielectric mirror layer. A material removal of the first dielectric mirror layer in the region of the first recess may be achieved by etching, for example by dry or wet chemical etching.

According to at least one embodiment of the method, a first current spreading layer is applied in the first recess and above the first dielectric mirror layer.

According to at least one embodiment of the method, a second recess is generated in the second dielectric mirror layer extending up to the first current spreading layer. The second recess completely penetrates the second dielectric mirror layer. A material removal of the second dielectric mirror layer in the region of the second recess may be achieved by etching, for example by dry or wet chemical etching.

According to at least one embodiment of the method, the first recess does not overlap with the second recess in lateral direction in plan view.

According to at least one embodiment of the method, after the application of the first dielectric mirror layer, a sacrificial layer comprising a third recess is applied above the first dielectric mirror layer. The third recess completely penetrates the sacrificial layer and may expose the first dielectric mirror layer in regions.

The sacrificial layer is, for example, a structured photoresist. The structured sacrificial layer may be applied by sputtering or vapour deposition above the first dielectric mirror layer.

According to at least one embodiment of the method, the sacrificial layer with the third recess acts as a mask for the first recess. That is to say that a lateral dimension of the first recess is predetermined by a lateral dimension of the third recess in the patterned sacrificial layer.

According to at least one embodiment of the method, after the first recess is generated, a fourth recess is generated in the sacrificial layer, which acts as a mask for the first current spreading layer. The fourth recess completely penetrates the sacrificial layer and may expose the first dielectric mirror layer in regions. The fourth recess may have a larger lateral dimension than the third recess. By a lateral dimension of the fourth recess in the structured sacrificial layer, a lateral dimension of the first current spreading layer may be predetermined.

The sacrificial layer may be removed after the application of the first current spreading layer.

BRIEF DESCRIPTION OF THE DRAWINGS

In the following, the radiation emitting semiconductor chip described herein and the method for producing the radiation emitting semiconductor chip described herein will be explained in more detail with reference to the Figures by means of exemplary embodiments.

They show.

Identical, similar or similar-acting elements are given the same reference signs in the Figures. The Figures and the proportions of the elements shown in the Figures are not to be regarded as true to scale. Rather, individual elements can be shown exaggeratedly large for better representability and/or for better comprehensibility.

DETAILED DESCRIPTION

Figure 1:
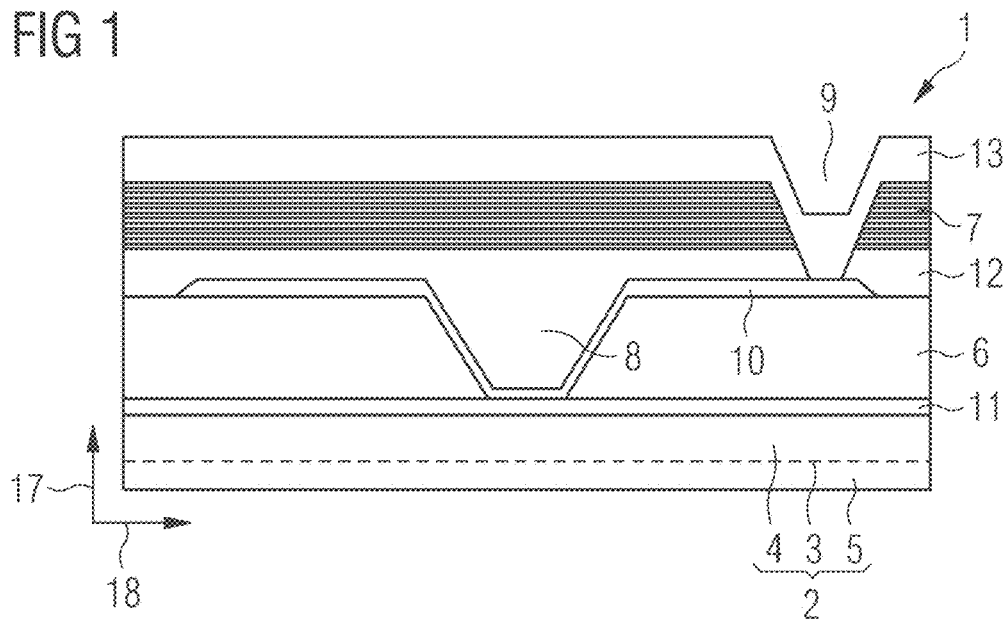
FIG. 1 a schematic sectional view of a radiation emitting semiconductor chip according to an exemplary embodiment, FIGS. 2 and 3 schematic views of a radiation emitting semiconductor chip according to an exemplary embodiment, FIGS. 4 and 5 each a schematic sectional view of a radiation emitting semiconductor chip according to an exemplary embodiment, FIGS. 6, 7, 8, 9 and 10 schematic sectional views of method stages of a method for producing a radiation emitting semiconductor chip according to an exemplary embodiment, and FIGS. 11 and 12 exemplary focused ion beam microscopy (FIB) images of a radiation emitting semiconductor chip according to an embodiment.

The radiation emitting semiconductor chip 1 according to the exemplary embodiment of FIG. 1 comprises a semiconductor layer sequence 2 having an active region 3 which is configured to generate electromagnetic radiation. The semiconductor layer sequence 2 has a first semiconductor layer 4 and a second semiconductor layer 5. In this exemplary embodiment, the first semiconductor layer 4 is formed p-doped and the second semiconductor layer 5 is formed n-doped.

Furthermore, the radiation emitting semiconductor chip 1 comprises a first dielectric mirror layer 6 and a second dielectric mirror layer 7, as well as a first current spreading layer 10 and a second current spreading layer 11.

The second current spreading layer 11 is arranged on the first semiconductor layer 4 and is in direct contact therewith. The second current spreading layer 11 is formed here with a TCO, such as zinc oxide, tin oxide, cadmium oxide, titanium oxide, indium oxide or indium tin oxide.

The first dielectric mirror layer 6 is arranged above the second current spreading layer 11. The first dielectric mirror layer 6 is in direct contact with the second current spreading layer 11. Furthermore, the first dielectric mirror layer 6 comprises a first recess 8. The first recess 8 completely penetrates the first dielectric mirror layer 6 and exposes the second current spreading layer 11. A side surface of the first recess 6 includes an angle of about 60° with a main extension plane of the semiconductor layer sequence 2.

In this exemplary embodiment, the first dielectric mirror layer 6 comprises $SiO_2$. Furthermore, the dielectric mirror layer 6 has an extension in the vertical direction 17 which may be at least 200 nanometres and at most 2000 nanometres.

The first current spreading layer 10 is arranged above the first dielectric mirror layer 6 and in the first recess 8. The first current spreading layer 10 completely covers the side surface of the first recess 8. Furthermore, the first current spreading layer 10 extends on a top surface of the first dielectric mirror layer 6 in lateral direction 18. In the region of the side surface of the first recess 8 and in the region of the top surface of the first dielectric mirror layer 6, the first current spreading layer 10 is in direct contact with the first dielectric mirror layer 6. Furthermore, the first current spreading layer 10 completely covers the exposed second current spreading layer 11. In this region, the first current spreading layer 10 and the second current spreading layer 11 are in direct contact. Thus, the first current spreading layer 10 in the first recess 8 is electrically conductively connected to the second current spreading layer 11.

In this exemplary embodiment, the second current spreading layer 11 may include ITO and has a thickness that is at least 5 nanometres and at most 30 nanometres, for example approximately 15 nanometres. Furthermore, the first current spreading layer 10 here may have an extension in the lateral direction 18 of at most 15 micrometres.

An intermediate layer 12 is arranged above the first dielectric mirror layer 6 and the first current spreading layer 11. In this exemplary embodiment, the intermediate layer 12 is a planarization layer. The intermediate layer 11 is formed by a spin-on glass, such as comprising silicon dioxide doped with, for example, boron or phosphorus.

The intermediate layer 12 completely fills the first recess 8. In this case, the intermediate layer 12 is in direct contact with the first current spreading layer 10 in the first recess 8. Furthermore, the intermediate layer 12 projects beyond the first current spreading layer 10 and the first dielectric mirror layer 6 in vertical direction 17. Furthermore, the intermediate layer 12 projects beyond the first current spreading layer 10 in lateral direction 18. A top surface of the intermediate layer 12 facing away from the semiconductor layer sequence 2 may be substantially smooth. That is to say that the top surface of the intermediate layer 12 has an average roughness of at most 100 nanometres.

A second dielectric mirror layer 7 is arranged above the intermediate layer 12. The second dielectric mirror layer 7 and the intermediate layer 12 are stacked on top of one another in vertical direction 17 and are in direct contact. In this exemplary embodiment, the second dielectric mirror layer 7 is a further Bragg mirror.

The second dielectric mirror layer 7 has a second recess 9. Furthermore, the intermediate layer 12 also has the second recess 9. The second recess 9 completely penetrates the second dielectric mirror layer 7 and the intermediate layer 12, so that the second recess 9 extends up to the first current spreading layer 10. A side surface of the second recess 9 includes an angle of about 60° with a main extension plane of the semiconductor layer sequence 2.

A metallic contact layer 13 is arranged above the second dielectric mirror layer 7. Furthermore, the metallic contact layer 13 is arranged in the second recess 9. The metallic contact layer 9 completely covers the side surface of the second recess 9. The metallic contact layer 9 is here in direct contact with the second dielectric mirror layer 7. The metallic contact layer 9 is formed with silver in this exemplary embodiment.

In the second recess 9, the metallic contact layer 13 is in direct contact with the first current spreading layer 10. Thus, the metallic contact layer 13 in the second recess 9 is electrically conductively connected to the first current spreading layer 10.

In plan view, the first recess 8 does not overlap with the second recess 9 in lateral direction 18. That is to say that in plan view, the first recess 8 is arranged spaced apart from the second recess 9 in lateral direction 18.

Figure 2:
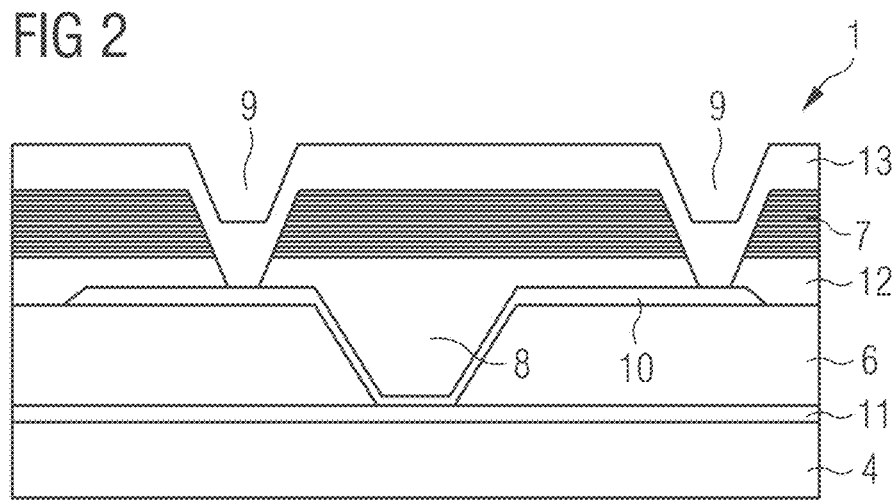
Figure 3:
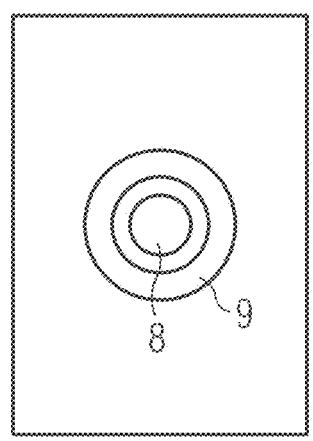

In the radiation emitting semiconductor chip 1 according to the exemplary embodiment of FIGS. 2 and 3, the second recess 9 completely surrounds the first recess 8 in lateral direction 18. In this exemplary embodiment, the second recess 9 is configured as a continuous trench. As in the exemplary embodiment of FIG. 1, the first recess 8 does not overlap with the second recess 9 in lateral direction 18 in plan view.

In contrast to the exemplary embodiment of FIG. 1, the radiation emitting semiconductor chip 1 according to the exemplary embodiment of FIG. 4 does not have a second current spreading layer 11. The first recess 8 completely penetrates the first dielectric mirror layer 6 and exposes the semiconductor layer sequence 2. Furthermore, in the exemplary embodiment of FIG. 4, in contrast to the exemplary embodiment of FIG. 1, the second semiconductor layer 5 is adjacent to and in direct contact with the first dielectric layer sequence. That is to say that the first recess 8 exposes the second semiconductor layer 5.

In this exemplary embodiment, the first current spreading layer 10 is electrically conductively connected to the semiconductor layer sequence, in particular the second semiconductor layer 5, in the first recess 8. In the region of the second semiconductor layer 5 exposed by the first recess 8, the first current spreading layer may be in direct contact with the second semiconductor layer 5.

The radiation emitting semiconductor chip 1 according to the exemplary embodiment of FIG. 5, in contrast to the exemplary embodiment of FIG. 4, does not have an intermediate layer 12. The second dielectric mirror layer 7 is arranged directly above the first current spreading layer 10 and the first dielectric mirror layer 6.

In this exemplary embodiment, the second dielectric mirror layer 7 is arranged in a first recess 8. A top surface of the second dielectric mirror layer 7 does not extend parallel to the main extension plane, but has a depression in the region of the first recess 8.

In this exemplary embodiment, the second dielectric mirror layer 7 comprises $SiO_2$. Furthermore, the dielectric mirror layer 7 has an extension in vertical direction 17 which may be at least 200 nanometres and at most 2000 nanometres. Furthermore, the first current spreading layer 10 here may extend in lateral direction 18 of at most 10 micrometres.

In this exemplary embodiment, the metallic contact layer 9 is formed with silver or aluminium.

Figure 6:
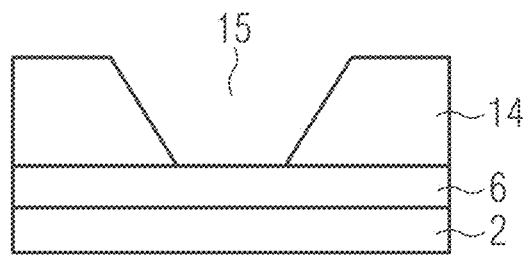

In the method according to the exemplary embodiment of FIGS. 6, 7, 8, 9 and 10, a semiconductor layer sequence 2 is provided, above which a first dielectric mirror layer 6 is applied, as shown in FIG. 6. Furthermore, a sacrificial layer 14 is applied above the first dielectric mirror layer 6, which has a third recess 15.

Figure 7:
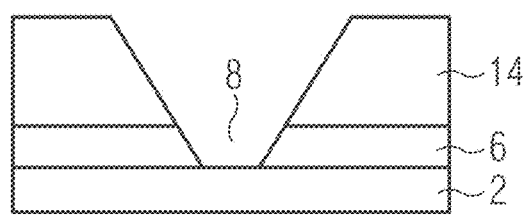

In a further method step, a first recess 8 is generated in the first dielectric mirror layer 6 by a dry chemical or wet chemical etching process (FIG. 7). The sacrificial layer 14 with the third recess 15 acts here as a mask for the first recess 8.

Figure 8:
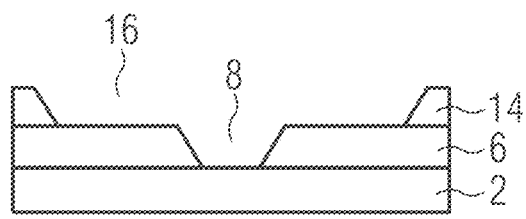

Subsequently, the sacrificial layer 14 is partially removed by an oxygen plasma in such a way that a fourth recess 16 is generated in the sacrificial layer 14 (see FIG. 8).

Figure 9:
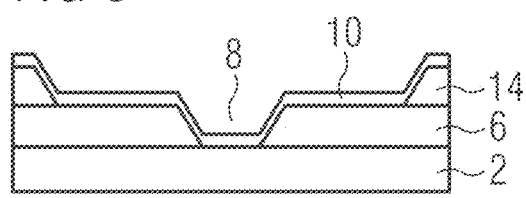

In a next method step, a first current spreading layer 10 is applied above the sacrificial layer, the first dielectric mirror layer 6 and the semiconductor layer sequence 2 (FIG. 9).

Figure 10:
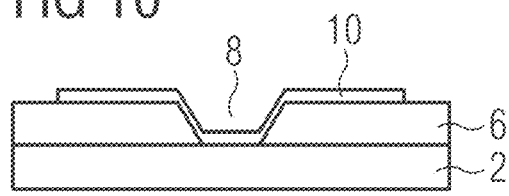

In a subsequent method step, the sacrificial layer 14 is removed by a lift-off process or an oxygen plasma (FIG. 10). The first current spreading layer 10, which covers the sacrificial layer 14, is also removed in this method step in the region of the sacrificial layer 14. The fourth recess 16 in the sacrificial layer 14 acts as a mask for the first current spreading layer 10 and predetermines the lateral dimensions of the first current spreading layer 10.

Figure 11:
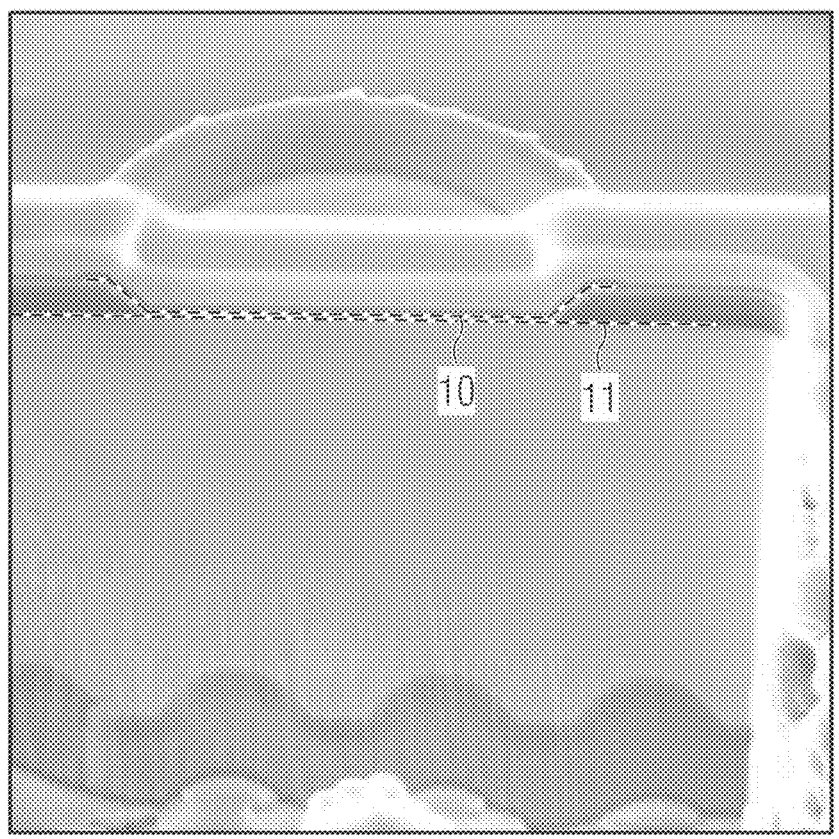
Figure 12:
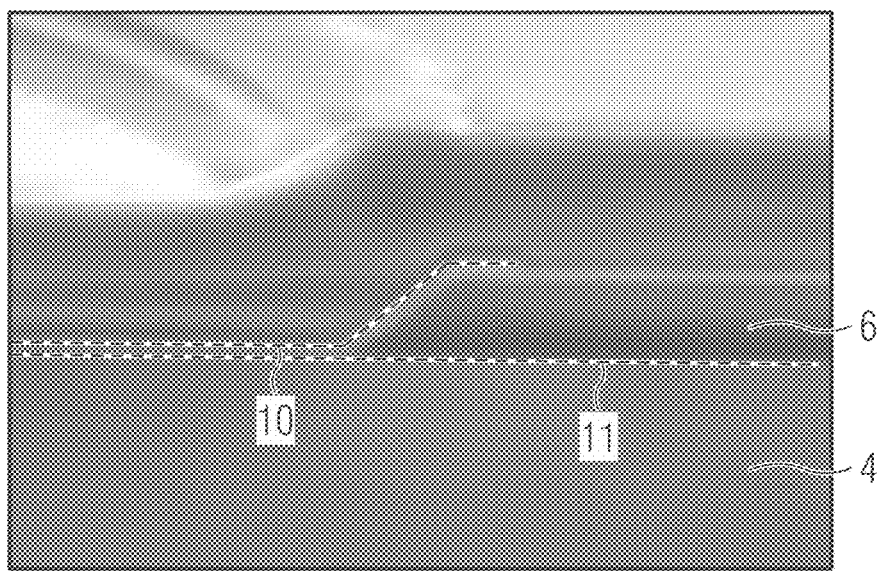

In the exemplary focused ion beam microscope image of a radiation emitting semiconductor chip according to an exemplary embodiment of FIGS. 11 and 12, the radiation emitting semiconductor chip 1 has a first current spreading layer 10 and a second current spreading layer 11. The dashed lines are of a virtual nature and are drawn only for better visualisation of the current spreading layers 10 and 11. Here, an extension in lateral direction 18 of the first current spreading layer 10 is at most 10 micrometres.

This patent application claims the priority of German patent application 102019120444.5, the disclosure content of which is hereby incorporated by reference.

The features and embodiments described in connection with the figures may be combined with one another according to further embodiments, even though not all combinations are explicitly described. Furthermore, the embodiments described in connection with the figures may alternatively or additionally have further features according to the description in the general part.

The invention is not limited by the description on the basis of the exemplary embodiments. Rather, the invention encompasses any new feature as well as any combination of features, which in particular includes any combination of features in the claims, even if this feature or combination itself is not explicitly indicated in the claims or exemplary embodiments.

LIST OF REFERENCE SIGNS 1 radiation emitting semiconductor chip
2 semiconductor layer sequence
3 active region
4 first semiconductor layer
5 second semiconductor layer
6 first dielectric mirror layer
7 second dielectric mirror layer
8 first recess
9 second recess
10 first current spreading layer
11 second current spreading layer
12 intermediate layer
13 metallic contact layer
14 sacrificial layer
15 third recess
16 fourth recess 17 vertical direction
18 lateral direction

The invention claimed is:

1. A radiation emitting semiconductor chip comprising:
a semiconductor layer sequence having an active region configured to generate electromagnetic radiation;
a first dielectric mirror layer arranged above the semiconductor layer sequence; and
a second dielectric mirror layer arranged above the first dielectric mirror layer;
an intermediate layer arranged between the first dielectric mirror layer and the second dielectric mirror layer;
wherein:
the first dielectric mirror layer has at least one first recess;
a first current spreading layer is arranged in the first recess and above the first dielectric mirror layer;
the first current spreading layer is formed transparent to the electromagnetic radiation generated;
the second dielectric mirror layer has at least one second recess extending up to the first current spreading layer;
the first recess does not overlap with the second recess in lateral direction in plan view; and
the intermediate layer completely fills the first recess and/or the second recess extends completely through the intermediate layer.

2. The radiation emitting semiconductor chip according to claim 1,
wherein the first current spreading layer in the first recess is electrically conductively connected to the semiconductor layer sequence.

3. The radiation emitting semiconductor chip according to claim 1,
further comprising a second current spreading layer arranged between the first dielectric mirror layer and the semiconductor layer sequence.

4. The radiation emitting semiconductor chip according to claim 3,
wherein the first current spreading layer in the first recess is electrically conductively connected to the second current spreading layer.

5. The radiation emitting semiconductor chip according to claim 1,
further comprising a metallic contact layer arranged above the second dielectric mirror layer; and
wherein the metallic contact layer is arranged in the second recess.

6. The radiation emitting semiconductor chip according to claim 5,
wherein the metallic contact layer in the second recess is electrically conductively connected to the first current spreading layer.

7. The radiation emitting semiconductor chip according to claim 6,
wherein the second dielectric mirror layer is arranged in the first recess.

8. A method for producing a radiation emitting semiconductor chip, wherein the method comprises:
providing a semiconductor layer sequence having an active region configured to generate electromagnetic radiation;
applying a first dielectric mirror layer above the semiconductor layer sequence;
generating a first recess in the first dielectric mirror layer which completely penetrates the first dielectric mirror layer;
applying a first current spreading layer in the first recess and above the first dielectric mirror layer;
applying a second dielectric mirror layer above the first dielectric mirror layer and the first current spreading layer;
generating a second recess in the second dielectric mirror layer which extends up to the first current spreading layer;
wherein:
an intermediate layer is arranged between the first dielectric mirror layer and the second dielectric mirror layer;
the first recess does not overlap with the second recess in lateral direction in plan view;
the first current spreading layer is formed transparent to the electromagnetic radiation generated; and
the intermediate layer completely fills the first recess and/or the second recess extends completely through the intermediate layer.

9. The method according to claim 8,
further comprising applying a sacrificial layer after applying the first dielectric mirror layer; wherein the sacrificial layer is applied above the first dielectric mirror layer;
wherein the sacrificial layer comprises a third recess.

10. The method according to claim 9,
wherein the sacrificial layer with the third recess acts as a mask for the first recess.

11. The method according to claim 9 further comprising generating a fourth recess, after generating the first recess, in the sacrificial layer which acts as a mask for the first current spreading layer.

12. A radiation emitting semiconductor chip comprising:
a semiconductor layer sequence having an active region configured to generate electromagnetic radiation;
a first dielectric mirror layer arranged above the semiconductor layer sequence; and
a second dielectric mirror layer arranged above the first dielectric mirror layer;
wherein:
the first dielectric mirror layer has at least one first recess;
a first current spreading layer is arranged in the first recess and above the first dielectric mirror layer;
the first current spreading layer is formed transparent to the electromagnetic radiation generated;
the second dielectric mirror layer has at least one second recess extending up to the first current spreading layer;
the first recess does not overlap with the second recess in lateral direction in plan view; and
the second recess completely surrounds the first recess in the lateral direction.

* * * * *